(12) United States Patent
Lai

(10) Patent No.: US 10,580,825 B2
(45) Date of Patent: Mar. 3, 2020

(54) METHOD OF MANUFACTURING DISPLAY DEVICE INCLUDING PHOTOLUMINESCENCE MEASUREMENT

(71) Applicant: PLAYNITRIDE INC., Tainan (TW)

(72) Inventor: Yu-Hung Lai, Tainan (TW)

(73) Assignee: PLAYNITRIDE INC., Tainan (TW)

( * ) Notice: Subject to any disclaimer, the term of this patent is extended or adjusted under 35 U.S.C. 154(b) by 0 days.

(21) Appl. No.: 16/230,629

(22) Filed: Dec. 21, 2018

(65) Prior Publication Data

US 2019/0115390 A1    Apr. 18, 2019

Related U.S. Application Data

(62) Division of application No. 15/496,880, filed on Apr. 25, 2017, now abandoned.

(30) Foreign Application Priority Data

Mar. 8, 2017   (TW) .............................. 106107605 A

(51) Int. Cl.
| | | |
|---|---|---|
| H01L 27/15 | (2006.01) | |
| H01L 27/32 | (2006.01) | |
| H01L 25/075 | (2006.01) | |
| H01L 21/66 | (2006.01) | |
| H01L 33/08 | (2010.01) | |
| H01L 33/02 | (2010.01) | |
| H01L 33/14 | (2010.01) | |
| H01L 33/22 | (2010.01) | |

(52) U.S. Cl.
CPC ............ H01L 27/156 (2013.01); H01L 22/20 (2013.01); H01L 25/0753 (2013.01); H01L 27/3216 (2013.01); H01L 27/3218 (2013.01); H01L 33/08 (2013.01); H01L 22/12 (2013.01); H01L 33/025 (2013.01); H01L 33/14 (2013.01); H01L 33/22 (2013.01)

(58) Field of Classification Search
CPC ... H01L 27/156; H01L 22/20; H01L 25/0753; H01L 33/08; H01L 22/12; H01L 33/22; H01L 33/14; H01L 33/025; H01L 27/3211–3218
See application file for complete search history.

(56) References Cited

U.S. PATENT DOCUMENTS

2017/0236807 A1 * 8/2017 Hwang ................... H01L 33/32
257/90
2017/0278906 A1 * 9/2017 Song ..................... H01L 27/326

FOREIGN PATENT DOCUMENTS

CN            108956550 A   * 12/2018

* cited by examiner

*Primary Examiner* — Nelson Garces
(74) *Attorney, Agent, or Firm* — Maschoff Brennan

(57) ABSTRACT

Disclosed are a method of manufacturing display device, an epitaxial wafer and a display device that includes a display substrate, a first sub pixel unit and a second sub pixel unit. The first sub pixel unit and the second sub pixel unit belong to same color type. The first sub pixel unit and the second sub pixel unit are formed from an epitaxial structure on the epitaxial wafer. The first sub pixel unit and the second sub pixel unit are formed and transferred to the display substrate from the epitaxial wafer. A first light emitting area of the first sub pixel unit and a second light emitting area of the second sub pixel unit are related to at least the photoluminescence measurement result of the epitaxial wafer.

6 Claims, 4 Drawing Sheets

&& # METHOD OF MANUFACTURING DISPLAY DEVICE INCLUDING PHOTOLUMINESCENCE MEASUREMENT

CROSS-REFERENCE TO RELATED APPLICATIONS

This application is a continuation patent application of U.S. application Ser. No. 15/496,880, filed on Apr. 25, 2017, which claims priority under 35 U.S.C. § 119(a) on Patent Application No(s). 106107605 filed in Taiwan, R.O.C. on Mar. 8, 2017, the entire contents of which are hereby incorporated by reference.

TECHNICAL FIELD

The disclosure relates to a display device and an epitaxial wafer, more particularly to a display device displaying images via light emitting diodes (LEDs), and a LED epitaxial wafer.

BACKGROUND

LEDs characterized by high energy conversion efficient, small in size and long-life have widely been applied to various electronic products. Usually, LEDs are used for indictors or lighting, or are used in a display device for display images. In brief, a LED has an illumination layer and at least two types of semiconductor layers, so manufacturers can produce different color LEDs by adjusting the material of the illumination layer and the materials of the semiconductor layers.

However, the semiconductor layers in various regions of the same wafer may have different epitaxial qualities during an epitaxy process. The uneven quality of epitaxy may cause the occurrence of deviation to the peak wavelengths of light emitted by LEDs that are driven. That is, a certain batch of LEDs, initially expected to emit the same color light, have a difference in color of light therebetween due to their uneven epitaxial qualities; the difference in color of light is even sensible to human's eyes.

Moreover, the microminiaturization of LEDs is very expectative in the next generation of semiconductor technology. The existing technology has been able to shrink LEDs down to a micrometer scale. However, since the sizes of LEDs are getting smaller, it becomes a very key factor to various LEDs whether the epitaxial quality of various LEDs is even or not. For some manufacturing processes of display panels, micro LEDs are formed by the same epitaxial wafer in a chip manufacturing process and then transferred to a substrate having driving circuits therein by the mass transfer technology. In other words, there is no chance to additionally classify LEDs during the manufacturing process. Therefore, when these LEDs with different epitaxial qualities are disposed in the same display device, the image quality of the display device will be affected, and the yield rate of production will also decrease.

SUMMARY

According to one or more embodiments, the disclosure provides a method of manufacturing display device which includes: providing an epitaxial structure; obtaining a photoluminescence measurement result of the epitaxial structure, wherein the photoluminescence measurement result comprises a plurality of measured peak wavelengths corresponding to different regions on the epitaxial structure; defining a non-deviation region and a deviation region of the epitaxial structure according to the photoluminescence measurement result, wherein the measured peak wavelength corresponding to the non-deviation region is equal to a standard peak wavelength or within a standard peak wavelength range, and the measured peak wavelength corresponding to the deviation region is unequal to the standard peak wavelength or out of the standard peak wavelength range; forming a first sub epitaxial structure having a first luminous area in the non-deviation region of the epitaxial structure; forming a second sub epitaxial structure having a second luminous area in the deviation region of the epitaxial structure, wherein the second luminous area is different from the first luminous area; forming two sub pixel units of the same color type on a display substrate by transferring two LED chips, which are formed respectively from the first sub epitaxial structure and the second sub epitaxial structure of the epitaxial structure, on the display substrate.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
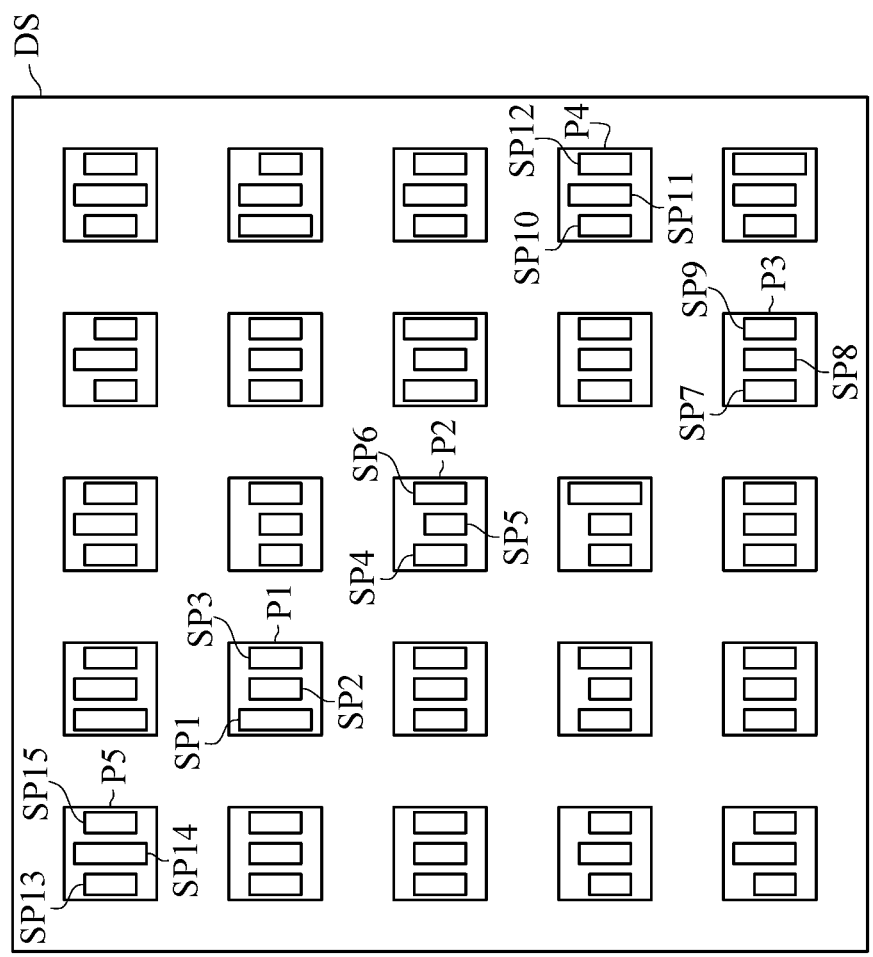
FIG. 1A is a top view of a display device according to an embodiment of the disclosure.

Please refer to FIG. 1A. FIG. 1A is a top view of a display device according to an embodiment of the disclosure. As shown in FIG. 1A, a display device 1 includes a display substrate DS and a plurality of pixel units. The plurality of pixel units is disposed on the display substrate DS. For a concise description, only 25 pixel units are shown in FIG. 1 and are arranged in an array. The following description will exemplify the pixel units P1, P2, P3, P4 and P5 of the 25 pixel units. However, the number of pixel units and the arrangement of the pixel units are not limited to what the figures show.

In the case of the pixel unit P1, the pixel unit P1 includes sub pixel units SP1, SP2 and SP3. For example, the sub pixel units SP1, SP2 and SP3 respectively emit light of different colors. In another aspect, the sub pixel units SP1, SP2 and SP3 belong to different color types, respectively. In an embodiment, the sub pixel unit SP1 emits red light, the sub pixel unit SP2 emits green light, and the sub pixel unit SP3 emits blue light. For other pixel units, the correlation among sub pixel units SP4, SP5 and SP6 in the pixel unit P2 is similar to that among the sub pixel units SP1, SP2 and SP3. That is, the sub pixel unit SP4 and the sub pixel unit SP1 belong to the same color type, the sub pixel unit SP5 and the sub pixel unit SP2 belong to the same color type, and the sub pixel unit SP6 and the sub pixel unit SP3 belong to the same color type. The related detail will not be repeatedly described hereafter. Different sub pixel units of the same color type are classified into a first sub pixel unit and a second sub pixel unit. For example, the sub pixel unit SP1 is defined as a first sub pixel unit, and the sub pixel unit SP4 is defined as a second sub pixel unit.

Figure 1B:
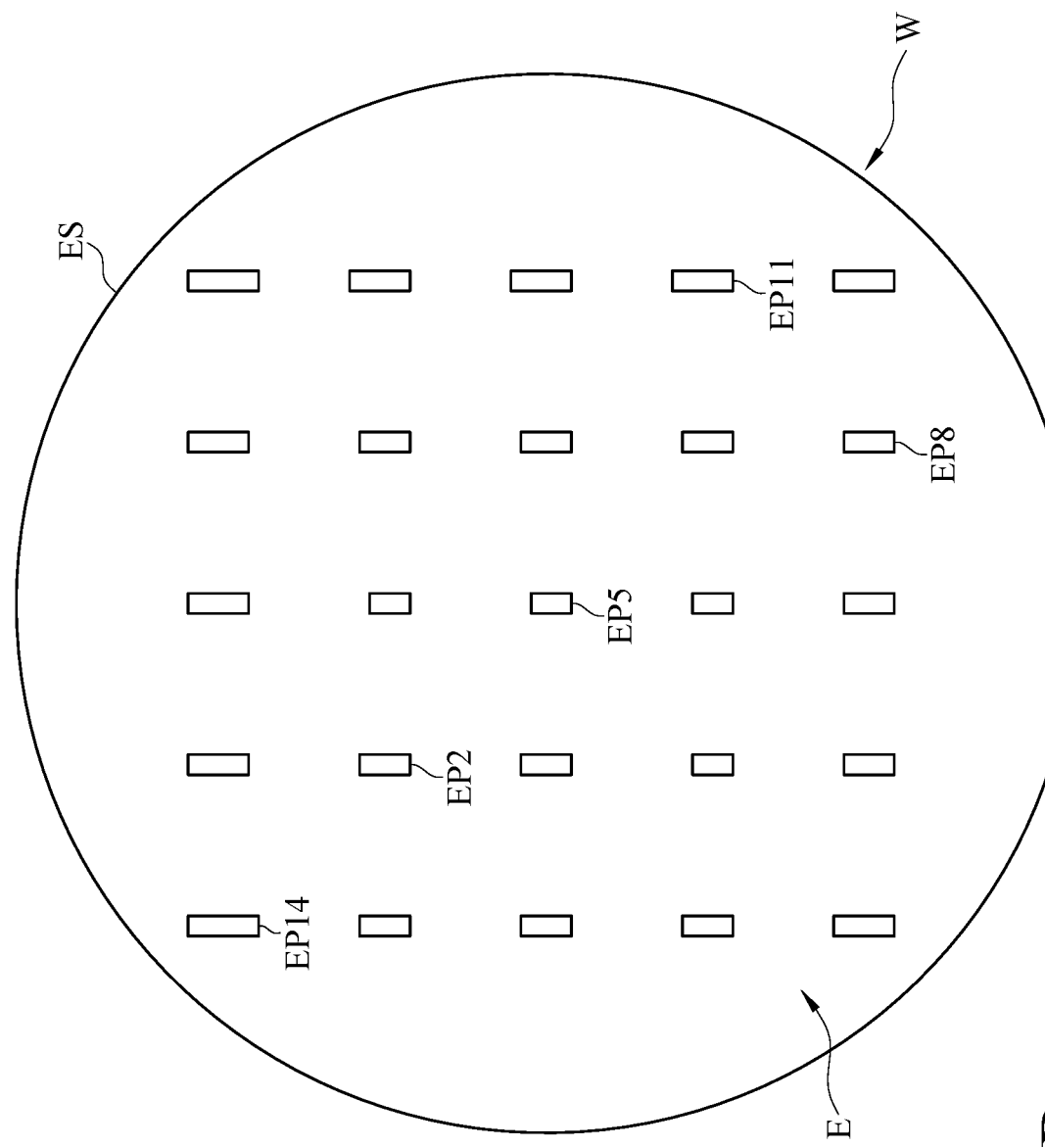
FIG. 1B is a top view of an epitaxial wafer according to an embodiment of the disclosure.

In a particular example, the aforementioned sub pixel units of the same color type is formed from the epitaxial structure of the same epitaxial wafer and then is transferred to the display substrate DS. Please further refer to FIG. 1B. FIG. 1B is a top view of an epitaxial wafer according to an embodiment of the disclosure. As shown in FIG. 1B, an epitaxial wafer W includes an epitaxial substrate ES and an epitaxial structure E formed on the epitaxial substrate ES. The epitaxial structure E contains one or more materials of II-VI group or one or more III-V nitrogen compound materials. Preferably, the thickness of the epitaxial structure E is not larger than 6 μm but is usually larger than 1 because the thickness being too thick or too thin will affect the production yield of the follow-up manufacturing process. For example, the epitaxial substrate ES is a sapphire substrate, silicon substrate or a GaN substrate.

The sub pixel units SP2, SP5, SP8, SP11 and SP14 are formed by directly transferring LED chips to the display substrate DS in the display device 1 after the LED chips are formed from sub epitaxial structures EP2, EP5, EP8, EP11 and EP14, defined in the epitaxial structure E of the epitaxial wafer W in a chip manufacturing process; or, the sub pixel units SP2, SP5, SP8, SP11 and SP14 are formed by transferring LED chips from a provisional substrate (not shown in drawings) to the display substrate DS in the display device 1 after the LED chips are formed from the sub epitaxial structures EP2, EP5, EP8, EP11 and EP14, defined in the epitaxial structure E of the epitaxial wafer W in a chip manufacturing process, and then is transferred to the provisional substrate (not shown in drawings). By transferring such sub pixel units of different color types to the display substrate DS, various pixel units are initially defined. Note that, in the same direction, the sub pixel units of the same color type in every two adjacent pixel units substantially have the same pitch therebetween on the display substrate DS. For example, the pitch between the sub pixel units SP2 and SP5 is substantially equal to the pitch between the sub pixel units SP2 and SP14 in the same direction. Therefore, the display device 1 may provide better display quality and visual experience to viewers.

In this embodiment, the display device 1 includes pixel units P1~P5, and each pixel unit includes at least one red sub pixel unit, at least one blue sub pixel unit, and at least one green sub pixel unit. In a detailed example, multiple red sub epitaxial structures are formed on a first epitaxial wafer, multiple green sub epitaxial structures are formed on a second epitaxial wafer, and multiple blue sub epitaxial structures are formed on a third epitaxial wafer; and then, LED chips are respectively formed from the sub epitaxial structures on the first, second and third epitaxial wafers in a chip manufacturing process and then are directly or indirectly transferred to the display substrate for forming the sub pixel units of the display device. After that, these sub pixel units can further be connected to a driving circuit on the display substrate. For the sub pixel units SP2, SP5, SP8, SP11 and SP14, their relative position before they are formed from the epitaxial wafer W, is substantially the same as the relative position of the sub pixel units SP2, SP5, SP8, SP11 and SP14 on the display substrate DS. In other words, the relative position of the sub epitaxial structures EP2, EP5, EP8, EP11 and EP14, before being used to form the sub pixel units SP2, SP5, SP8, SP11 and SP14 on the epitaxial wafer W, is substantially the same as the relative position of the sub pixel units SP2, SP5, SP8, SP11 and SP14 on the display substrate DS. In brief, the sub pixel units SP2, SP5, SP8, SP11 and SP14 correspond to the sub epitaxial structures EP2, EP5, EP8, EP11 and EP14, the following exemplary description will mainly focus on the sub pixel units SP2, SP5, SP8, SP11 and SP14.

As described above, an example based on the sub pixel units SP2 and SP5 is taken as follows. The sub pixel unit SP2 has a first luminous area, and the sub pixel unit SP5 has a second luminous area. The sizes of the first and second luminous areas are related to a photoluminescence measurement result of the epitaxial substrate in an epitaxial process. In this and the following embodiments, each sub pixel unit is exemplarily defined to be rectangle-shaped, but other shapes, such as a circular shape, may be contemplated in this or some embodiments. In this case, each of the sub pixel units SP2, SP5, SP8, SP11 and SP14 has a maximum width ranging from 1 to 100 μm, and preferably ranging from 3 to 30 μm.

That is, the scale of each of the sub pixel units SP2, SP5, SP8, SP11 and SP14 is a micrometer scale. Therefore, the display device may have a better display resolution. Note that the driving current density of each of the sub pixel units SP2, SP5, SP8, SP11 and SP14 on the micrometer scale falls in a preferable range between 0.001 A/cm$^2$ and 5 A/cm$^2$ in a low current operation. That is, the sub pixel units SP2, SP5, SP8, SP11 and SP14 may have better efficiency under low driving current density.

During the manufacturing process of sub epitaxial structures, the measurement result of one or more relevant test items can be timely provided according to the epitaxial wafer, and compensation and calibration can also be timely performed. For example, the aforementioned photoluminescence measurement result is obtained by measuring the initial light emission result of each part of the epitaxial substrate of the epitaxial wafer in a photoluminescence measurement process before the sizes of the sub epitaxial structures are defined on the epitaxial structure. In an embodiment, the photoluminescence measurement result includes the information about the measured peak wavelength distribution. In another embodiment, the photoluminescence measurement result includes the information about a measured luminous intensity distribution. In yet another embodiment, a photoluminescence measurement result includes information about a measured luminous efficiency distribution. More particularly, the measured peak wavelength distribution, in an example in this embodiment, indicates the peak wavelength of light emitted by each region that is excited on the epitaxial structure of the epitaxial wafer. Since the epitaxial quality of a sub epitaxial structure is related to the location of the sub epitaxial structure in the epitaxial structure, the user can use the correlation to initially judge how each variable in the manufacturing process affects the peak wavelength of light emitted by each sub pixel unit.

Said photoluminescence measurement result is obtained by, for example, measuring the epitaxial structure of the epitaxial wafer based on a standard area that is set as a unit area, and the manufacturer can, according to the photoluminescence measurement result and the standard area, define a standard peak wavelength range for a reference basis. That is, theoretically, the peak wavelength of light emitted by a sub epitaxial structure having the standard area should fall within the standard peak wavelength range. In an embodiment, the measured peak wavelength distribution can also be used together with the standard peak wavelength range and a reference luminous area to define various regions in the epitaxial structure of the wafer for compensation and calibration. When the measured peak wavelength corresponding to a measured position in a certain region of the epitaxial structure is larger than the upper limitation of the standard peak wavelength range, this region will be defined as a positive deviation region. When the measured peak wavelength corresponding to a measured position in a certain region of the epitaxial structure is shorter than the lower limitation of the standard peak wavelength range, this region will be defined as a negative deviation region. When the measured peak wavelength corresponding to a measured position in a certain region of the epitaxial structure is not shorter than the lower limitation of the standard peak wavelength range and not larger than the upper limitation of the standard peak wavelength range, this region will be defined as a non-deviation region.

The definitions and amounts of the aforementioned positive deviation region, negative deviation region and non-deviation region or whether to additionally define other regions, can be freely set according to particular requirements in view of the disclosure by one of ordinary skill in the art, and are not limited to the disclosure.

In another aspect, assume that the luminous area corresponding to a sub epitaxial structure in a positive deviation region, the luminous area corresponding to a sub epitaxial structure in a non-deviation region, and the luminous area corresponding to a sub epitaxial structure in a negative deviation region are substantially equal to each other. When the same driving current is applied to sub pixel units respectively corresponding to a positive deviation region, a non-deviation region and a negative deviation region among the sub pixel units formed from transferring sub epitaxial structures formed in a chip manufacturing process to a display substrate, the peak wavelength of light emitted by the sub pixel unit corresponding to the positive deviation region is longer than the peak wavelength of light emitted by the sub pixel unit corresponding to the non-deviation region, and the peak wavelength of light emitted by the sub pixel unit corresponding to the negative deviation region is shorter than the peak wavelength of light emitted by the sub pixel unit corresponding to the non-deviation region. The difference in peak wavelength will become larger if the driving current has a low driving current density.

To deal with this situation, in an embodiment, the luminous area corresponding to the sub pixel unit in the positive deviation region is defined to be smaller than the standard area, the luminous area corresponding to the sub pixel unit in the non-deviation region is defined to be substantially equal to the standard area, and the luminous area corresponding to the sub pixel unit in the negative deviation region is defined to be larger than the standard area. In practice, the aforementioned standard peak wavelength range can further be narrowed to become a standard peak wavelength. In this condition, a region corresponding to a measured wavelength longer than the standard peak wavelength is defined as a positive deviation region, a region corresponding to a measured wavelength substantially equal to the standard peak wavelength is defined as a non-deviation region, and a region corresponding to a measured wavelength shorter than the standard peak wavelength is defined as a negative deviation region.

Figure 2A:
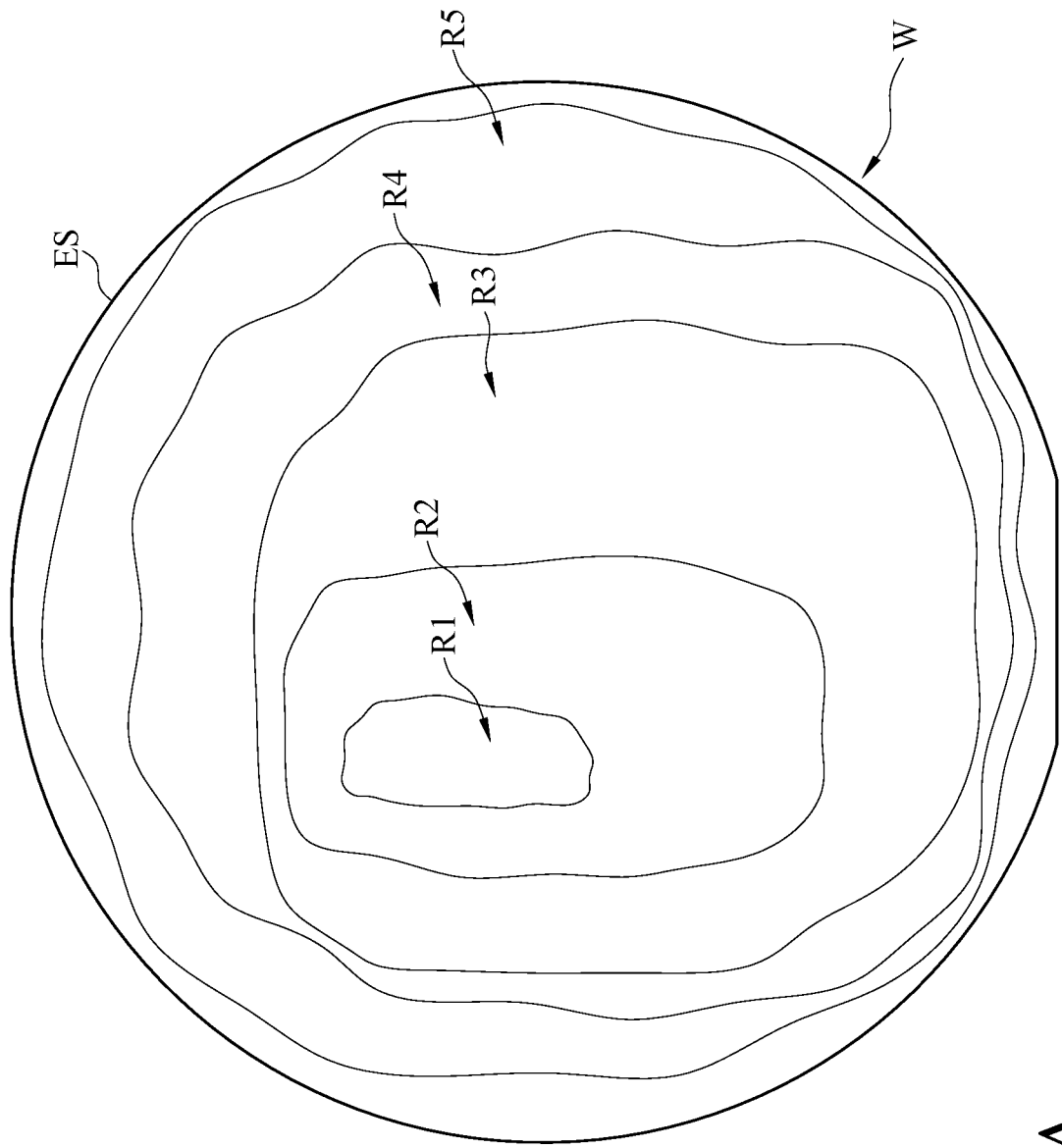
FIG. 2A is a schematic diagram of the photoluminescence measurement result of the epitaxial wafer according to an embodiment of the disclosure.
Figure 2B:
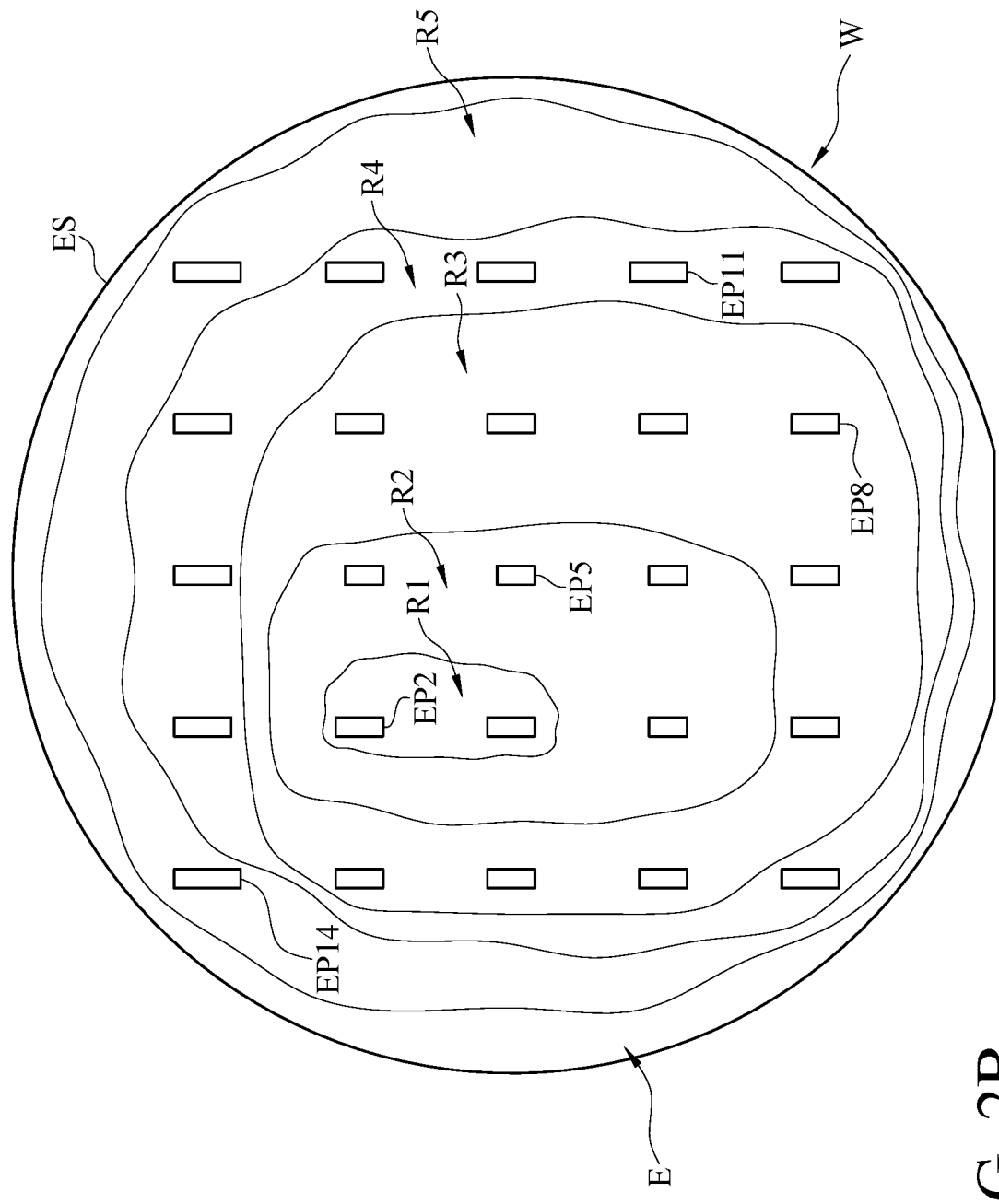
FIG. 2B is a schematic diagram of a comparison of the photoluminescence measurement results of sub pixel units and an epitaxial wafer according to an embodiment of the disclosure.

Next, please refer to FIG. 2A and FIG. 2B. FIG. 2A is a schematic diagram of the photoluminescence measurement result of the epitaxial wafer according to an embodiment of the disclosure, and FIG. 2B is a schematic diagram of a comparison of the photoluminescence measurement results of sub pixel units and an epitaxial wafer according to an embodiment of the disclosure. Concretely, FIG. 2A illustrates the measured peak wavelength distribution in the photoluminescence measurement result. Each closed curve in FIG. 2A represents a wavelength, and a region between every two closed curves corresponds to a wavelength range. In other words, the regions R1~R5 in FIG. 2A respectively correspond to different wavelength ranges. In practice, the measured luminous intensity distribution or luminous efficiency distribution in the photoluminescence measurement result can be used to produce relevant diagrams or tables, and the disclosure does not intend to limit the use of parameters.

In the embodiment shown in FIG. 2A, the measured wavelength corresponding to the region R1 is not longer than the upper limitation of the standard peak wavelength range and is not shorter than the lower limitation of the standard peak wavelength range, so the region R1 can be considered as the aforementioned non-deviation region. The measured wavelength corresponding to the region R2 is longer than the upper limitation of the standard peak wavelength range, so the region R2 can be considered as the aforementioned positive deviation region. The measured wavelength corresponding to the region R3 is not longer than the upper limitation of the standard peak wavelength range and is not shorter than the lower limitation of the standard peak wavelength range, so the region R3 can be considered as the aforementioned non-deviation region. The measured wavelength corresponding to the region R4 is shorter than the lower limitation of the standard peak wavelength range, so the region R4 can be considered as the aforementioned negative deviation region. The measured wavelength corresponding to the region R5 is shorter than the lower limitation of the standard peak wavelength range, so the region R5 can be considered as the aforementioned negative deviation region. Since the measured wavelength corresponding to the region R5 is shorter than the measured wavelength corresponding to the region R4, the measured wavelength corresponding to the region R5 deviates from the standard peak wavelength range more than the measured wavelength corresponding to the region R4.

FIG. 2B is a schematic comparison diagram obtained by superimposing a part of the sub pixel units in FIG. 1A on the measured wavelength distribution in FIG. 2A for exemplarily illustrating the correlation between the sizes of luminous areas of sub pixel units and the regions R1~R5. As shown in FIG. 1A to FIG. 2B, the sub pixel unit SP2 of the pixel unit P1 formed from the sub epitaxial structure EP2 corresponds to the region R1 of the epitaxial wafer W. As described above, the region R1 is a non-deviation region. In a particular example based on the color type that is green light, the standard peak wavelength range is not larger than 536 nm and not shorter than 534 nm; the measured peak wavelength corresponding to the sub pixel unit SP2 is 535 nm and falls within the standard peak wavelength range. That is, when the luminous area of the sub pixel unit SP2 is defined as a standard area, the sub pixel unit SP2 is driven by a current to emit light whose peak wavelength is within a tolerant range, and does not need to additionally adjust the luminous area of the sub pixel unit SP2. Therefore, the luminous area of the sub pixel unit SP2 is defined to be substantially equal to the standard area. Similarly, the luminous area of the sub pixel unit SP8 of the pixel unit P3 is defined to be substantially equal to the standard area.

On the other hand, the sub pixel unit SP5 of the pixel unit P2 corresponds to the region R2 of the epitaxial wafer W. As described above, the region R2 is a positive deviation region. In a particular example, the standard peak wavelength range is not larger than 536 nm and not shorter than 534 nm. In this condition, the measured peak wavelength corresponding to the sub pixel unit SP5 is, for example, 537 nm and is larger than the upper limitation of the standard peak wavelength range. That is, when the luminous area of the sub pixel unit SP5 is defined as a standard area, the sub pixel unit SP5 is driven by a current to emit light whose peak wavelength exceeds the upper limitation of the tolerant range, so that it is necessary to additionally adjust the luminous area of the sub pixel unit SP5. Therefore, the luminous area of the sub pixel unit SP5 is defined to be smaller than the standard area. In another aspect, the luminous area of the sub pixel unit SP5 corresponding to a high deviation region is smaller than the luminous area of the sub pixel unit SP2 corresponding to a non-deviation region. For example, the luminous area of the sub pixel unit SP5 is 90% of the luminous area of the sub pixel unit SP2. Therefore, the peak wavelength of light emitted by the sub pixel unit SP5 may almost fall within the standard peak wavelength range.

The sub pixel unit SP11 of the pixel unit P4 corresponds to the region R4 of the epitaxial wafer W. As described above, the region R4 is a negative deviation region. In a particular example, the standard peak wavelength range is not larger than 536 nm and not shorter than 534 nm. In this condition, the measured peak wavelength corresponding to the sub pixel unit SP11 is, for example, 533 nm that is shorter than the lower limitation of the standard peak wavelength range. That is, when the luminous area of the sub pixel unit SP11 is defined as a standard area, the sub pixel unit SP11 is driven by a current to emit light with a peak wavelength shorter than the lower limitation of the tolerant range, so that it is necessary to additionally adjust the luminous area of the sub pixel unit SP11. Therefore, the luminous area of the sub pixel unit SP11 is defined to be larger than the standard area. That is, the luminous area of the sub pixel unit SP11 is larger than the luminous area of the sub pixel unit SP2. In another aspect, the luminous area of the sub pixel unit SP11 corresponding to a negative deviation region is larger than the luminous area of the sub pixel unit SP2 corresponding to a non-deviation region. For example, the luminous area of the sub pixel unit SP11 is 110% of the luminous area of the sub pixel unit SP2. In this way, the peak wavelength of light emitted by the sub pixel unit SP11 may almost fall within the standard peak wavelength range.

Similar to the sub pixel unit SP11, the luminous area of the sub pixel unit SP14 is defined to be larger than a standard area. In this embodiment, the measured peak wavelength corresponding to the sub pixel unit SP14 is, for example, 531 nm and is shorter than the measured peak wavelength corresponding to the sub pixel unit SP11. That is, when the luminous area of the sub pixel unit SP14 is defined as a standard area, the sub pixel unit SP14 is driven by a current to emit light with a peak wavelength that deviates from the lower limitation of the tolerant range more than the peak wavelength of light emitted by the sub pixel unit SP11. Therefore, the luminous area of the sub pixel unit SP14 is defined to be larger than not only the standard area but also the luminous area of the sub pixel unit SP11. Therefore, the peak wavelength of light emitted by the sub pixel unit SP14 may almost fall within the standard peak wavelength range.

Briefly, when the measured peak wavelength corresponding to a sub pixel unit falls within a standard peak wavelength range, the luminous area of the sub pixel unit is defined as a standard area. When the measured peak wavelength corresponding to a sub pixel unit is larger than a standard peak wavelength range, the luminous area of the sub pixel unit is defined to be smaller than the standard area. When the measured peak wavelength corresponding to a sub pixel unit is shorter than a standard peak wavelength range, the luminous area of the sub pixel unit is defined to be larger than the standard area. The degree of deviation of the measured peak wavelength from the standard peak wavelength range affects the degree of adjustment in the luminous area of each sub pixel unit. By adjusting the luminous area of each sub pixel unit, the peak wavelength of light emitted by each sub pixel unit driven by a current is properly calibrated, so that each sub pixel unit that is driven can emit light with a peak wavelength falling within the standard peak wavelength range. In another embodiment, the luminous area can be properly calibrated according to the measured luminous intensity distribution or the luminous efficiency distribution in the photoluminescence measurement result. When the measured intensity distribution or luminous efficiency corresponding to a sub pixel unit is in the standard intensity distribution or luminous efficiency range, the luminous area of this sub pixel unit is defined as a standard area. When the measured intensity distribution or luminous efficiency corresponding to a sub pixel unit is larger than the standard intensity distribution or luminous efficiency range, the luminous area of this sub pixel unit is defined to be smaller than the standard area. When the measured intensity distribution or luminous efficiency corresponding to a sub pixel unit is smaller than the standard intensity distribution or luminous efficiency range, the luminous area of this sub pixel unit is defined to be larger than the standard area. The degree of deviation of the measured intensity distribution or luminous efficiency from the standard intensity distribution or luminous efficiency range decides the degree of adjustment in luminous area for each sub pixel unit. By adjusting the luminous area of each sub pixel unit, the luminous intensity of light emitted by each sub pixel unit driven by a current may be properly calibrated, so that the luminous intensity of light emitted by each sub pixel unit that is driven may fall in the standard intensity distribution or luminous efficiency range.

In an embodiment, the sub pixel units of the same color type in the display device 1 can emit respective light having a difference in peak wavelength therebetween, which is not larger than 2 nm. As described in the aforementioned example, the standard peak wavelength range is not larger than 536 nm and not shorter than 534 nm, i.e. 535 nm ±1 nm. Therefore, the screen of the display device 1 may become more uniform and harmonious.

Moreover, the exemplary description is based on green sub pixel units, and however, in practice, the luminous areas of red sub pixel units and blue sub pixel units can be adjusted by the foregoing method. Therefore, the sub pixel units of the same color type in the display device may have a substantially identical peak wavelength of emitted light, luminous intensity or luminous efficiency. In other words, as shown in FIG. 1A, for the display device experiencing calibration or manufacturing as described above, all luminous areas of the green sub pixel units may not be the same, all luminous areas of the red sub pixel units may not be the same, and all luminous areas of the blue sub pixel units may not be the same. The increase rate or decrease rates of the luminous areas of the sub pixel units of each color type can be adjusted according to particular requirements by one of ordinary skill in the art, and thus, they may be different.

As described above, in practice, the manufacturer can define a patterning process according to the photoluminescence measurement result, and define various luminous areas for sub epitaxial structures in the epitaxial structure in the patterning process, form sub pixel units having different luminous areas from the sub epitaxial structures in a chip manufacturing process, and then transfer the sub pixel units to a display substrate by mass transfer technology. Or, through such a defined patterning process, the luminous areas of all sub pixel units of the same color type are substantially and properly equalized, so that the manufacturing process can be simplified. Or, the manufacturer can define one universal patterning process or different universal patterning processes using one or more past photoluminescence measurement results, so as to get a balance between the manufacturing cost and the yield rate of production. The above exemplary description is based on a color type of sub pixel units, but one of ordinary skill in the art can simultaneously and respectively adjust luminous areas for more than one color type of sub pixel units in view of the disclosure.

According to the above embodiments, the disclosure provides a display device and an epitaxial structure. In an exemplary embodiment, the display device includes a first sub pixel unit and a second sub pixel unit, and the luminous areas of the first and second sub pixel units are related to the photoluminescence measurement result of a related epitaxial substrate in an epitaxial process. Therefore, the first and second sub pixel units formed based from the same epitaxial wafer may substantially have the same color of emitted light when the peak wavelength of light emitted by the first sub pixel unit and the peak wavelength of light emitted by the second sub pixel unit are appropriately calibrated.

What is claimed is:

1. A method of manufacturing display device, comprising:
providing an epitaxial structure;
obtaining a photoluminescence measurement result of the epitaxial structure, wherein the photoluminescence measurement result comprises a plurality of measured peak wavelengths corresponding to different regions on the epitaxial structure;
defining a non-deviation region and a deviation region of the epitaxial structure according to the photoluminescence measurement result, wherein the measured peak wavelength corresponding to the non-deviation region is equal to a standard peak wavelength or within a standard peak wavelength range, and the measured peak wavelength corresponding to the deviation region is unequal to the standard peak wavelength or out of the standard peak wavelength range;
forming a first sub epitaxial structure having a first luminous area in the non-deviation region of the epitaxial structure;
forming a second sub epitaxial structure having a second luminous area in the deviation region of the epitaxial structure, wherein the second luminous area is different from the first luminous area; and
forming two sub pixel units of the same color type on a display substrate by transferring two LED chips, which are formed respectively from the first sub epitaxial structure and the second sub epitaxial structure of the epitaxial structure, on the display substrate.

2. The method of manufacturing display device according to claim 1, wherein the two sub pixel units are a first sub pixel unit and a second sub pixel unit, respectively,
when the measured peak wavelength corresponding to the first sub pixel unit is larger than an upper limitation of a reference wavelength range, the first luminous area of the first sub pixel unit is determined as smaller than a standard area; and
when the measured peak wavelength corresponding to the first sub pixel unit is smaller than a lower limitation of the reference wavelength range, the first luminous area of the first sub pixel unit is determined as larger than the standard area.

3. The method of manufacturing display device according to claim 2, wherein the first sub pixel unit is driven in a driving current to generate first emitted light, the second sub pixel unit is driven in the same driving current to generate second emitted light, and a difference between the peak wavelength of the first emitted light and the peak wavelength of the second emitted light is less than a first predetermined threshold.

4. The method of manufacturing display device according to claim 3, wherein the first predetermined threshold is not larger than 2 nm.

5. The method of manufacturing display device according to claim 3, wherein a current density of the first sub pixel unit and a current density of the second sub pixel unit range from 0.001 A/cm$^2$ to 5 A/cm$^2$.

6. The method of manufacturing display device according to claim 1, wherein the two sub pixel units belong to two different pixel units.

* * * * *